United States Patent
Song et al.

(10) Patent No.: US 10,199,586 B2
(45) Date of Patent: Feb. 5, 2019

(54) DEVICE COMPRISING DIELECTRIC INTERLAYER

(71) Applicant: Xerox Corporation, Norwalk, CT (US)

(72) Inventors: Guiqin Song, Milton (CA); Ping Mei, San Jose, CA (US); Nan-Xing Hu, Oakville (CA); Gregory Whiting, Menlo Park, CA (US); Biby Esther Abraham, Mississauga (CA)

(73) Assignees: Xerox Corporation, Norwalk, CT (US); Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/221,885

(22) Filed: Jul. 28, 2016

(65) Prior Publication Data
US 2018/0033982 A1 Feb. 1, 2018

(51) Int. Cl.
*H01L 51/10* (2006.01)
*H01L 51/00* (2006.01)
*H01L 51/05* (2006.01)

(52) U.S. Cl.
CPC ........ *H01L 51/107* (2013.01); *H01L 51/0096* (2013.01); *H01L 51/0541* (2013.01); *H01L 2251/30* (2013.01)

(58) Field of Classification Search
CPC .............. H01L 51/107; H01L 51/0096; H01L 51/0541; H01L 2251/30; H01L 51/10; H01L 51/00; H01L 51/05
See application file for complete search history.

(56) References Cited

U.S. PATENT DOCUMENTS 7,270,694 B2 9/2007 Li et al.
8,324,294 B2 9/2012 Wu et al.
(Continued)

FOREIGN PATENT DOCUMENTS

EP 0 947 532 B1 10/1999
JP 2006 089530 A 6/2006

OTHER PUBLICATIONS

Guiqin Song, et al., U.S. Appl. No. 14/981,419, filed Dec. 28, 2015, "Interlayer Composition for Electronic Printing," not yet published.
(Continued)

*Primary Examiner* — Thanh T Nguyen
(74) *Attorney, Agent, or Firm* — Marylou J. Lavoie, Esq. LLC

(57) ABSTRACT

A process for preparing a device and a device including a substrate; an interlayer disposed on the substrate, wherein the interlayer comprises a cured film formed from an interlayer composition, wherein the interlayer composition comprises: an epoxy compound; a polyvinyl phenol; a melamine resin; a solvent; an optional surfactant; and an optional catalyst; a source electrode and a drain electrode disposed on a surface of the interlayer; a semiconductor layer disposed on the interlayer, wherein the semiconductor layer is disposed into a gap between the source and drain electrode; a back channel interface comprising an interface between the semiconductor layer and the interlayer, wherein the interlayer serves as a back channel dielectric layer for the device; a dielectric layer disposed on the semiconductor layer; a gate electrode disposed on the dielectric layer. Also an interlayer composition and an organic thin film transistor comprising the interlayer composition.

19 Claims, 4 Drawing Sheets

Coat gate dielectic film on semiconductor

(56) References Cited

U.S. PATENT DOCUMENTS

| | | |
|---|---|---|
| 8,765,025 B2 | 7/2014 | Wu et al. |
| 8,913,917 B2 | 12/2014 | Liu et al. |
| 9,174,432 B2 | 11/2015 | Liu et al. |
| 2012/0100667 A1* | 4/2012 | Koutake ............ H01L 51/0007 438/99 |
| 2013/0207091 A1 | 8/2013 | Wierzchowiec et al. |
| 2014/0312284 A1 | 10/2014 | Liu et al. |
| 2015/0108447 A1* | 4/2015 | Kobayashi ........... C07D 493/06 257/40 |
| 2015/0240101 A1 | 8/2015 | Chopra et al. |
| 2016/0126502 A1* | 5/2016 | Furukawa ........... H01L 51/5268 257/40 |
| 2016/0177111 A1 | 6/2016 | Goredema et al. |
| 2016/0200931 A1 | 7/2016 | Goredema et al. |

OTHER PUBLICATIONS

Guiqin Song, et al., U.S. Appl. No. 15/099,937, filed Apr. 15, 2016, "Interlayer Compositions and Devices Made Therefrom," not yet published.

Extended European Search Report issued in European Application No. 17182804.9-1555, dated Dec. 15, 2017, 6 pages.

Patent Abstracts of Japan, Publication No. 2006089530, published Jun. 4, 2006, 1 page.

\* cited by examiner

Coat dielectric layer on substrate

Print source and drain electrodes on the surface of the interlayer

Print semiconductor onto the gap between the source and drain electrode

DEVICE COMPRISING DIELECTRIC INTERLAYER

BACKGROUND

The present invention is directed to an interlayer composition and devices formed therefrom.

For printed electronics, various metal nanoparticle inks including silver inks are broadly used in electronic device integrations. The printed conductor inks are often used as electrodes for various devices such as diodes and transistors. Therefore, in addition to high conductivity, the conductor ink should ideally provide a suitable interface for charge injection in device applications. Challenges often encountered include the ink wetting on the substrates which affects printing quality (printing line quality/resolution), uneven or not smooth surface of the substrate which makes the printing impossible, the loss of the ink conductivity and poor ink adhesion to substrates.

Previously Xerox® Corporation developed silver nanoparticles and inks which can be solution processed by ink jet printing for various electronic device applications. Xerox® Corporation has invented a nanosilver particle which is stabilized by an organoamine U.S. Pat. No. 8,765,025, which is hereby incorporated by reference herein in its entirety, describes a metal nanoparticle composition that includes an organic-stabilized metal nanoparticle and a solvent in which the solvent selected has the following Hansen solubility parameters: a dispersion parameter of about 16 $MPa^{0.5}$, or more, and a sum of a polarity parameter and a hydrogen bonding parameter of about 8.0 $MPa^{0.5}$ or less. U.S. Pat. No. 7,270,694, which is hereby incorporated by reference herein in its entirety, describes a process for preparing stabilized silver nanoparticles comprising reacting a silver compound with a reducing agent comprising a hydrazine compound by incrementally adding the silver compound to a first mixture comprising the reducing agent, a stabilizer comprising an organoamine, and a solvent.

U.S. patent application Ser. No. 13/866,704, which is hereby incorporated by reference herein in its entirety, describes stabilized metal-containing nanoparticles prepared by a first method comprising reacting a silver compound with a reducing agent comprising a hydrazine compound by incrementally adding the silver compound to a first mixture comprising the reducing agent, a stabilizer comprising an organoamine, and a solvent. U.S. patent application Ser. No. 14/188,284, which is hereby incorporated by reference herein in its entirety, describes conductive inks having a high silver content for gravure and flexographic printing and methods for producing such conductive inks.

Xerox® Corporation has developed flexographic and gravure inks based on silver nanoparticle technology. U.S. patent application Ser. No. 14/594,746, which is hereby incorporated by reference herein in its entirety, describes in the Abstract thereof a nanosilver ink composition including silver nanoparticles; polystyrene; and an ink vehicle. A process for preparing a nanosilver ink composition is described comprising combining silver nanoparticles; polystyrene; and an ink vehicle. A process for forming conductive features on a substrate using flexographic and gravure printing processes is described comprising providing a nanosilver ink composition comprising silver nanoparticles; polystyrene; and an ink vehicle; depositing the nanosilver ink composition onto a substrate to form deposited features; and heating the deposited features on the substrate to form conductive features on the substrate.

U.S. patent application Ser. No. 14/573,191, which is hereby incorporated by reference herein in its entirety, describes in the Abstract thereof a nanosilver ink composition including silver nanoparticles; a clay dispersion; and an ink vehicle. A process for forming conductive features on a substrate is described including providing a nanosilver ink composition comprising silver nanoparticles; a clay dispersion; and an ink vehicle; depositing the nanosilver ink composition onto a substrate to form deposited features; and heating the deposited features on the substrate to form conductive features on the substrate. Inks have been successfully formulated in non-polar solvents such as decalin and bicyclohexyl and successfully printed using inkjet printing technologies.

U.S. patent application Ser. No. 14/981,419, which is hereby incorporated by reference herein in its entirety, describes in the Abstract thereof an interlayer composition including an epoxy resin; a polyvinyl phenol; a poly (melamine-co-formaldehyde) polymer; a solvent; an optional surfactant and an optional catalyst. A device including a substrate; an interlayer disposed thereon; and conductive features; wherein the interlayer is formed from a composition comprising an epoxy resin; a polyvinyl phenol; a poly(melamine-co-formaldehyde) polymer; an optional surfactant and an optional catalyst. A process for forming conductive features on a substrate including depositing an interlayer onto a substrate; thermally curing the interlayer; depositing a conductive composition onto the interlayer to form deposited features; and annealing the deposited features to form conductive features.

U.S. patent application Ser. No. 15/099,937, which is hereby incorporated by reference herein in its entirety, describes in the Abstract thereof a composition formed from ingredients comprising: an epoxy; a polyvinyl phenol; a cross-linking agent; an epoxy silane; and a solvent. A printable medium and other devices made from the composition are also disclosed.

A thin-film transistor (TFT) is a special kind of field-effect transistor made by depositing thin films of an active semiconductor layer as well as the dielectric layer and metallic contacts over a supporting (but non-conducting) substrate. A common substrate is glass, because the primary application of TFTs is in liquid-crystal displays. This differs from the conventional transistor, where the semiconductor material typically is the substrate, such as a silicon wafer. Organic thin-film transistor (OTFT) technology involves the use of organic semiconducting compounds in electronic components. A thin film is a layer of material ranging from fractions of a nanometer (monolayer) to several micrometers in thickness.

In order to provide a high performance printed organic thin film transistor (OTFT), a controllable line width with a minimal line-to-line spacing is required for the OTFT source and drain electrode printing. In addition, the electric properties, such as charge-trapping and emission at the interface of the interlayer and a semiconductor, are of importance as they affect transistor performance.

Solution based all-additive printing processes enable low cost fabrication of electronic devices on a large area flexible substrate. These printing processes offer several advantages including fast prototyping with on-demand custom device; patterning devices at low temperature, and applying to a broad range of applications for electronic device manufacture.

Many of these printing processes use organic semiconductors. Organic thin-film transistors (OTFT) have low electron or hole mobility. Because of this low mobility, the desired device performance requires a large ratio of the thin-film transistor (TFT) channel width to channel length (W/L). In order to achieve a high transistor current during device on state, it is desired to make the channel length, which is the dimension of the gap between the source and drain electrodes, as small as possible. Shown in FIG. 1 is a cross-sectional view of a top-gate OTFT 10. The OTFT 10 includes a substrate 12 and thereupon an interlayer 14. Source electrode 16 and drain electrode 18 form a gap or channel 20 therebetween. Semiconductor layer 22 is disposed between the gap 20. Gate dielectric layer 24 is disposed upon the semiconductor layer 22. Gate electrode 26 is disposed upon the gate dielectric layer 24. A voltage applied to the gate electrode imposes an electric field 28 into the semiconductor channel, which accumulates or depletes charge carried in the channel. The back channel interface 30 is the interface between the semiconductor layer 22 and the interlayer 14. Since the semiconductor layer 22 is thin (typically 50 nanometers), the gate voltage has a strong field effect at the back channel interface 30. In an undesired situation, charges may be moved in and out from the interlayer 14 to the semiconductor 22, causing poor device performance in terms of slow subthreshold slope and higher off-state leakage current.

Solution processable conducting materials including silver nanoparticle inks play an important role in electronic device integrations. Silver nanoparticle inks can be easily dispersed in suitable solvents and used to fabricate various conducting features in electronic devices such as electrodes and electrical interconnectors by low-cost solution deposition and patterning techniques and especially by ink jet printing technologies.

The conductive features formed from metal nanoparticles such as silver nanoparticle inks on suitable substrates, including glasses and flexible plastic substrates, must have sufficient adhesion and mechanical robustness characteristics to enable proper electronic device fabrications and functions. However, one of the issues is that adhesion on certain substrates such as glasses and polyimide may not be adequate in some instances for robust device fabrications. The adhesion issue was tackled previously by addition of a small amount of polymeric materials including polyvinyl butyral (PVB) resin in silver conducting inks as an adhesion promoter. This approach is suitable for some applications. However, a potential disadvantage of this method is that the electrical conductivity of printed conductive features from such inks could, in some instances, be decreased significantly. Therefore, it is necessary to develop effective methods to improve adhesion and enable formation of devices with robust mechanical properties without sacrificing electric conductivity of metal nanoparticle inks used in electronic device applications.

Currently available compositions and methods are suitable for their intended purposes. However a need remains for improved electronic device compositions and methods. Further, a need remains for an improved method for providing sufficient adhesion and mechanical robustness characteristics while also maintaining desired electrical conductivity of the printed conductive features. Further, a need remains for an interlayer composition having the characteristics of film forming capability, adequate film adhesion, in embodiments, adequate film adhesion to glass substrates, ability to accept conductive ink, in embodiments silver ink, wherein a film formed from the interlayer allows desired adhesion of conductive ink to the film, non-polar solvent based silver ink wettability, and desired conductivity. In embodiments, what is desired is an interlayer composition providing a combination of these desired characteristics; that is, an interlayer composition that provides all of the following characteristics: film forming ability, film adhesion to glass, ink adhesion to film, non-polar solvent based ink wettability, and desired conductivity. Further, a need remains for a high performance printed organic thin film transistor (OTFT) and improved method for preparing same, providing a controllable line width with a minimal line-to-line spacing which is required for the OTFT source and drain electrode printing. In addition, a need remains for an improved device and process providing electric properties, such as charge-trapping and emission at the interface of the interlayer and a semiconductor. Further, a need remains to address the issue that organic thin-film transistors (OTFT) have low electron or hole mobility. Because of this low mobility, the desired device performance requires a large ratio of the thin-film transistor (TFT) channel width to channel length (W/L). In order to achieve a high transistor current during device on state, a need remains for improved devices and processes to make the channel length, which is the dimension of the gap between the source and drain electrodes, as small as possible.

The appropriate components and process aspects of the each of the foregoing U.S. patents and patent Publications may be selected for the present disclosure in embodiments thereof. Further, throughout this application, various publications, patents, and published patent applications are referred to by an identifying citation. The disclosures of the publications, patents, and published patent applications referenced in this application are hereby incorporated by reference into the present disclosure to more fully describe the state of the art to which this invention pertains.

SUMMARY

Described is a device comprising a substrate; an interlayer disposed on the substrate, wherein the interlayer comprises a cured film formed from an interlayer composition, wherein the interlayer composition comprises: an epoxy compound; a polyvinyl phenol; a melamine resin; a solvent; an optional surfactant; and an optional catalyst; a source electrode and a drain electrode disposed on a surface of the interlayer; a semiconductor layer disposed on the interlayer, wherein the semiconductor layer is disposed into a gap between and over the source and drain electrode; a back channel interface comprising an interface between the semiconductor layer and the interlayer, wherein the interlayer serves as a back channel dielectric layer for the device; a gate dielectric layer disposed on the semiconductor layer; and a gate electrode disposed on the dielectric layer.

Also described is a process for preparing a device comprising providing a substrate; disposing an interlayer composition on to the substrate, wherein the interlayer composition comprises: an epoxy compound; a polyvinyl phenol; a melamine resin; a solvent; an optional surfactant; and an optional catalyst; treating the interlayer composition to form a cured interlayer film; disposing a source electrode and a drain electrode on a surface of the interlayer; disposing a semiconductor layer on the interlayer, wherein the semiconductor layer is disposed into a gap between and over the source and drain electrode; wherein the interlayer serves as a back channel dielectric layer for the device and wherein the interlayer serves as a back channel interface comprising an interface between the semiconductor layer and the interlayer; disposing a dielectric layer on the semiconductor layer; and disposing a gate electrode on the dielectric layer.

Also described is an organic thin film transistor comprising a substrate; an interlayer disposed on the substrate, wherein the interlayer comprises a cured film formed from an interlayer composition, wherein the interlayer composition comprises: an epoxy compound; a polyvinyl phenol; a melamine resin; a solvent; an optional surfactant; and an optional catalyst; a source electrode and a drain electrode disposed on a surface of the interlayer; a semiconductor layer disposed on the interlayer, wherein the semiconductor layer is disposed into a gap between and over the source and drain electrode; a back channel interface comprising an interface between the semiconductor layer and the interlayer, wherein the interlayer serves as a back channel dielectric layer for the device; a dielectric layer disposed on the semiconductor layer; a gate electrode disposed on the dielectric layer; wherein the thin film transistor has current on-off ratio of at least about $10^{-5}$.

Also described is an interlayer composition comprising an epoxy compound, wherein the epoxy compound is an aliphatic epoxy compound or epoxy polymer made therefrom, and wherein the aliphatic epoxy compound is a compound of the formula

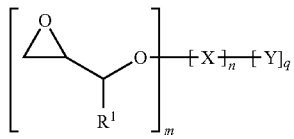

wherein X is a saturated or unsaturated, linear, branched or cyclic aliphatic group having 1 to 60 carbon atoms and at least one oxygen atom; wherein Y is selected from the group consisting of a glycidyl group, an epoxy group, an oxyalkyl (—OR) group, and a hydroxyl group, wherein R is an alkyl; wherein $R^1$ is selected from the group consisting of hydrogen, alkyl, or $OR^2$, wherein $R^2$ is a $C_1$ to $C_3$ alkyl group or an epoxy group; wherein m is from about 1 to about 10; wherein n is from about 1 to about 20; and wherein q is from about 0 to about 10; a polyvinyl phenol; a melamine resin; a solvent; an optional surfactant; and an optional catalyst.

DETAILED DESCRIPTION

Figure 1:
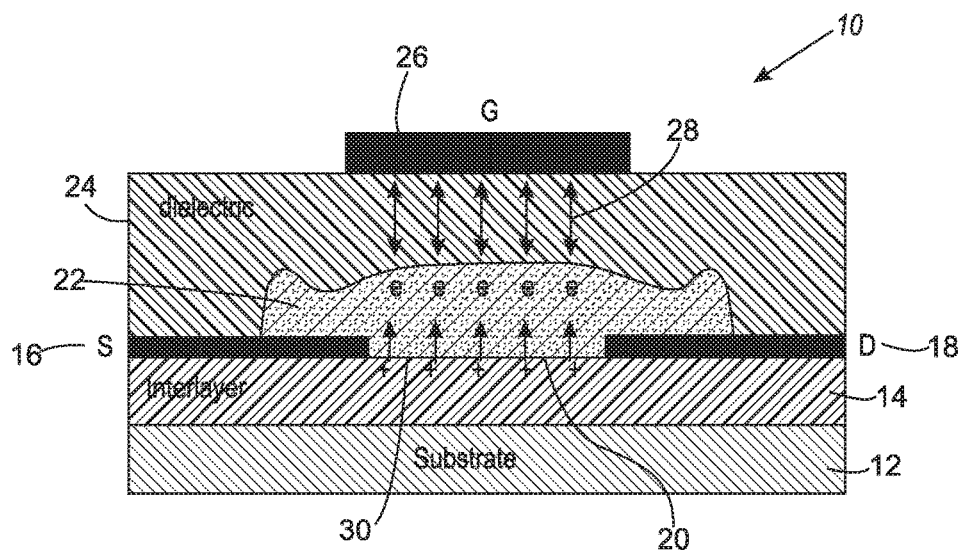
FIG. 1 is a cross-sectional view of a top gate organic thin film transistor.

In embodiments, an organic thin film transistor device is provided comprising an interlayer, which is a cured/cross-linked film formed from a mixture composition. The mixture composition comprises a specific epoxy composition. Unlike other commercially available epoxy coating materials, the interlayer composition herein offers superior wettability for deposition of electrodes with well-defined line width and line-to-line spacing, and significantly improved adhesion for ink jet printed silver traces. In addition, the organic transistor device shows low off-state leakage current and good sub-threshold slope, indicating that the interlayer provides the desired property as the back channel dielectric.

In order to achieve a high transistor current during device on state, it is desired to make the channel length, which is the dimension of the gap between the source and drain electrodes, as small as possible. In embodiments herein, this is achieved by using a specific interlayer coating to control the conductive ink contact angle and wettability to form well defined conductive line width and line-to-line spacing. In addition to controlling the conductive ink wettability, the interlayer serves as the back channel dielectric material for OTFT.

In embodiments, a device is provided comprising a substrate; an interlayer disposed on the substrate, wherein the interlayer comprises a cured film formed from an interlayer composition, wherein the interlayer composition comprises: an epoxy compound; a polyvinyl phenol; a melamine resin; a solvent; an optional surfactant; and an optional catalyst; a source electrode and a drain electrode disposed on a surface of the interlayer; a semiconductor layer disposed on the interlayer, wherein the semiconductor layer is disposed into a gap between and on the top surface of the source and drain electrode; a back channel interface comprising an interface between the semiconductor layer and the interlayer, wherein the interlayer serves as a back channel dielectric layer for the device; a dielectric layer disposed on the semiconductor layer; a gate electrode disposed on the dielectric layer. In embodiments, the semiconductor layer is disposed into a gap between the source and drain electrode and over at least a portion of the top surface of each of the source and drain electrode.

An organic thin film transistor device is described comprising a specific interlayer and a method for making the same. In embodiments, the interlayer comprises a cured/cross-linked film formed from a mixture of epoxy and polyvinyl phenol polymer as well as melamine resin. In embodiments, the interlayer composition comprises:
  an epoxy compound;
  a polyvinyl phenol;
  a melamine resin; and
  an optional catalyst.

In embodiments, the interlayer composition comprises an aliphatic epoxy compound of the following formula, or an epoxy polymer made therefrom:

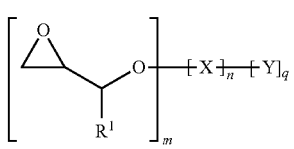

where X can be a saturated or unsaturated, linear, branched or cyclic aliphatic group having 1 to 70 carbon atoms, such as 1 to 60, 1 to 30, 2 to 20 or 2 to 10 carbon atoms, and at least one oxygen atom; Y can be defined as a glycidyl group, epoxy group, oxyalkyl (—OR) group or hydroxyl group; R can be an alkyl, such as $C_1$ to $C_6$ alkyl; $R^1$ can be a hydrogen atom, an alkyl, such as $C_1$ to $C_6$ alkyl, or an —$OR_2$ group, where $R_2$ can be a $C_1$ to $C_3$ alkyl or an epoxy group; m ranges from 1 to 10, such as 1 to 5; n ranges from 1 to 20, such as 1 to 5 and q ranges from 0 to 10, such as 1 to 5. In one embodiment, m and q are both 1. In another embodiment, m, n and q are all 1. The at least one oxygen atom in the aliphatic group X can be included as any oxygen containing group, including, but not limited to, glycidyl groups, epoxy groups, ether groups, carbonyl groups, carboxylic acid ester groups, hydroxyl groups, oxyalkyl (—OR) groups and combinations thereof.

In embodiments, X is of the formula

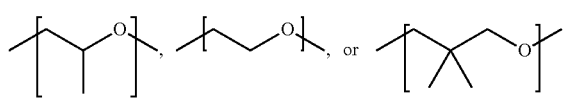

In embodiments, Y is an epoxy group of the formula:

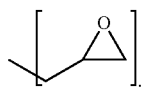

In certain embodiments, X is a saturated or unsaturated, linear, branched or cyclic aliphatic group having 1 to 60 carbon atoms and at least one oxygen atom; Y is selected from the group consisting of a glycidyl group, an epoxy group, an oxyalkyl (—OR) group, and a hydroxyl group, wherein R is an alkyl; wherein $R^1$ is selected from the group consisting of hydrogen, alkyl, or $OR^2$, wherein $R^2$ is a $C_1$ to $C_3$ alkyl group or an epoxy group; m is from about 1 to about 10; n is from about 1 to about 20; and q is from about 0 to about 10.

In embodiments, the interlayer composition comprises an epoxy compound of the following formula, or an epoxy polymer made therefrom:

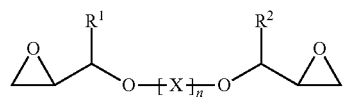

wherein X comprises an aliphatic group having from at least 2 to about 20 carbon atoms, wherein the aliphatic group can be a saturated or unsaturated, linear, branched or cyclic aliphatic group, and wherein X is free of aromatic moieties, and wherein n is from about 1 to about 20; such as 1 to 5, wherein $R_1$ and $R_2$ are each independently selected from the group consisting of a hydrogen atom, an alkyl group, in embodiments a $C_1$ to $C_6$ alkyl, an $OR^2$ group, wherein $R^2$ can be selected from the group consisting of a $C_1$ to $C_3$ alkyl group, a glycidyl group, and an epoxy group.

In certain embodiments, the epoxy comprises one or more of the following aliphatic compounds or an epoxy polymer made therefrom, where the aliphatic compounds are selected from compounds of the formula:

1,4-Butanediyl diglycidyl ether of the formula

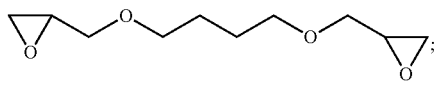 [SMILES: C(CCOCC1CO1)COCC1CO1]

1,6-Hexanediol diglycidyl ether of the formula

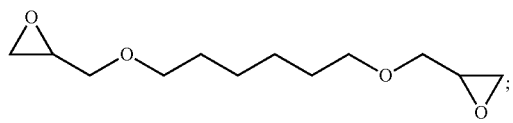 [SMILES: C(CCCOCC1CO1)CCOCC1CO1]

1,4-Cyclohexanedimethanol diglycidyl ether of the formula

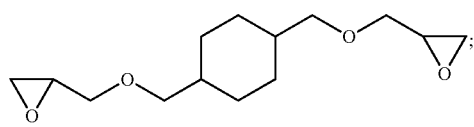 [SMILES: C1CC(COCC2CO2)CCC1COCC1CO1]

Neopentyl glycol diglycidyl ether of the formula

1,2,3-Propanetriol glycidyl ethers of the formula

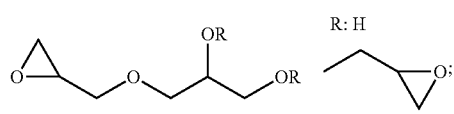

Trimethylolpropane triglycidyl ether of the formula

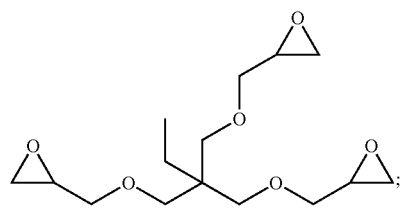 [SMILES: CCC(COCC1CO1)(COCC1CO1)COCC1CO1]

epichlorohydrin polymer of the formula

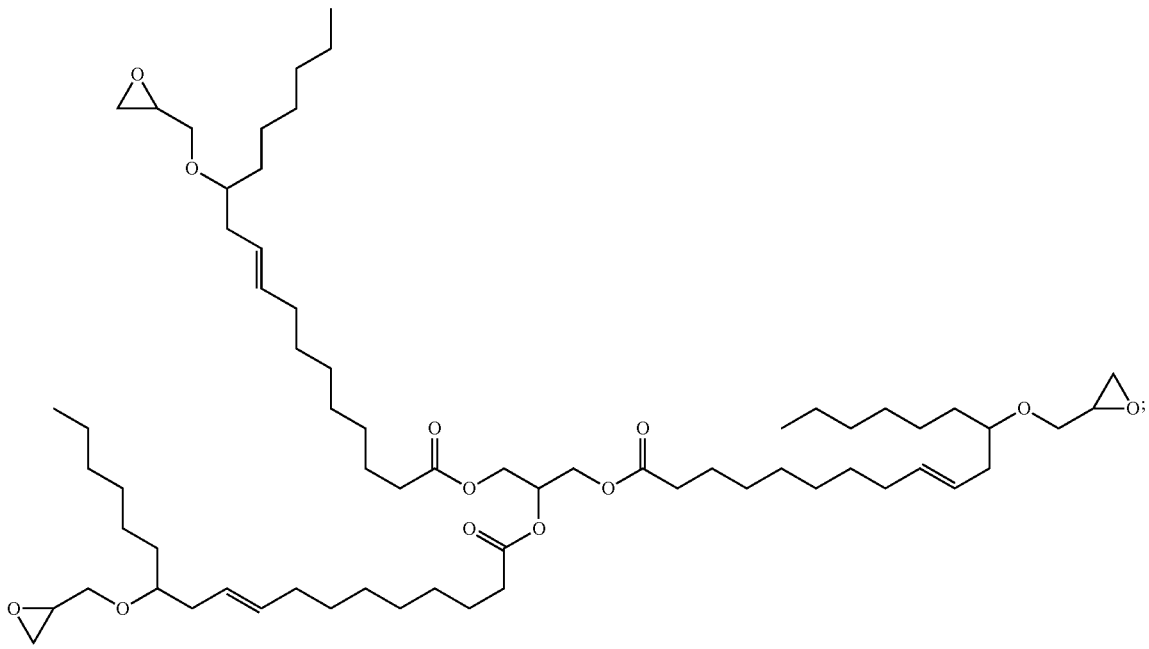 [SMILES: CCCCCCC(C/C=C/CCCCCCCC(=O)OCC(COC(=O)CCCCCCC/C=C/CC(CCCCCC)OCC1CO1)OC(=O)CCCCCCC/C=C/CC(CCCCCC)OCC1CO1)OCC1CO1]

Pentaerythritrol polyglycidyl ether of the formula

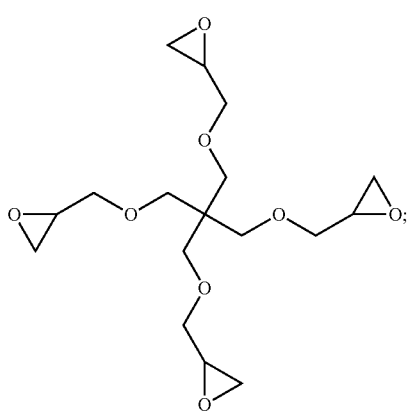 [SMILES: C(OCC(COCC1CO1)(COCC1CO1)COCC1CO1)C1CO1]

Poly(ethylene glycol) diglycidyl ether of the formula

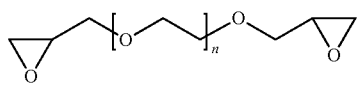

wherein n is from 1 to 15, such as 1 to 10, or from 3 to 9, in embodiments, from 2 to 15; and Poly(propylene glycol) diglycidyl ether of the formula

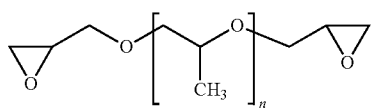

wherein n is from 1 to 15, such as 1 to 10, or from 3 to 9, or from 2 to 15, in embodiments from 2 to 10.

More examples of suitable aliphatic glycidyl epoxy include C12-C14 glycidyl ether, Ethylhexylgylcidylether, Polyglycerol-3-glycidyl ether, Cyclohexanedimethanol-diglycidyl ether, Glycerol-trigylcidyl ether, Penthaerythritol-polyglycidyl ether, 2-Ethyhexyl-glycidyl ether; Tris-(hydroxyl phenyl)-methane-based epoxy and cycloaliphatic epoxides. Commercially available epoxies include GNS SG-8008, GNS SG-8116 and the POLYPDX™ family of glycidyl ethers, such as POLYPDX™ R3, POLYPDX™ R6, POLYPDX™ R7, POLYPDX™ R9, POLYPDX™ R11, POLYPDX™ R12, POLYPDX™ R14, POLYPDX™ R16, POLYPDX™ R17, POLYPDX™ R18, POLYPDX™ R19, POLYPDX™ R20 and POLYPDX™ R24, all of which are available from DOW Chemical Company of Midland, Mich.

Any suitable or desired polyvinyl phenol can be selected for the compositions herein. In embodiments, the polyvinyl phenol is selected from the group consisting of poly(4-vinylphenol), poly(vinylphenol)/poly(methyl acrylate), poly(vinylphenol)/poly(methyl methacrylate), poly(4-vinylphenol)/poly(vinyl methyl ketone), and combinations thereof.

Any suitable or desired melamine resin can be selected for the compositions herein. In embodiments, the melamine resin comprises a poly(melamine-co-formaldehyde) based polymer. In embodiments, the melamine resin is selected from the group consisting of poly(melamine-co-formaldehyde), methylated poly(melamine-co-formaldehyde), butylated poly(melamine-co-formaldehyde), isobutylated poly(melamine-co-formaldehyde), acrylated poly(melamine-co-formaldehyde), methylated/butylated poly(melamine-co-formaldehyde), and combinations thereof.

The epoxy composition for forming the interlayer film may further include a solvent. Any suitable or desired solvent can be selected for the present interlayer compositions. In embodiments, the solvent is selected from the group consisting of propylene glycol methyl ether acetate, propylene glycol monomethyl ether acetate, toluene, methyl isobutyl ketone, butylacetate, methoxypropylacetate, xylene, tripropyleneglycol monomethylether, dipropyleneglycol monomethylether, propoxylated neopentylglycoldiacrylate, and combinations thereof.

In embodiments, the solvent can be a non-polar organic solvent selected from the group consisting of hydrocarbons such as alkanes, alkenes, alcohols having from about 7 to about 18 carbon atoms such as undecane, dodecane, tridecane, tetradecane, hexadecane, 1-undecanol, 2-undecanol, 3-undecanol, 4-undecanol, 5-undecanol, 6-undecanol, 1-dodecanol, 2-dodecanol, 3-dedecanol, 4-dedecanol, 5-dodecanol, 6-dodecanol, 1-tridecanol, 2-tridecanol, 3-tridecanol, 4-tridecanol, 5-tridecanol, 6-tridecanol, 7-tridecanol, 1-tetradecanol, 2-tetradecanol, 3-tetradecanol, 4-tetradecanol, 5-tetradecanol, 6-tetradecanol, 7-tetradecanol, and the like; alcohols such as terpineol ($\alpha$-terpineol), $\beta$-terpineol, geraniol, cineol, cedral, linalool, 4-terpineol, 3,7-dimethylocta-2, 6-dien-1ol, 2-(2-propyl)-5-methyl-cyclohexane-1-ol; isoparaffinic hydrocarbons such as isodecane, isododecane; commercially available mixtures of isoparaffins such as Isopar™ E, Isopar™ G, Isopar™ H, Isopar™ L, Isopar™ V, Isopar™ G, manufactured by Exxon Chemical Company; Shellsol® manufactured by Shell Chemical Company; Soltrol® manufactured by Chevron Phillips Chemical Company; Begasol® manufactured by Mobil Petroleum Co., Inc.; IP Solvent 2835 manufactured by Idemitsu Petrochemical CO., Ltd; naphthenic oils; aromatic solvents such as benzene, nitrobenzene, toluene, ortho-, meta-, and para-xylene, and mixtures thereof; 1,3,5-trimethylbenzene (mesitylene); 1,2-, 1,3-, and 1,4-dichlorobenzene and mixtures thereof, trichlorobenzene; cyanobenzene; phenylcyclohexane and tetralin; aliphatic solvents such as isooctane, nonane, decane, dodecane; cyclic aliphatic solvents such as dicyclohexyl and decalin; and mixtures and combinations thereof.

In embodiments, two or more solvents can be used.

The solvent can be provided in the interlayer composition in any suitable or desired amount. In embodiments, the solvent is present in an amount of from about 50 to about 90 percent, or from about 60 to about 80 percent, or from about 70 to about 80 percent, by weight, based on the total weight of the interlayer composition.

The epoxy composition for forming the interlayer film may further include a surfactant. Any suitable or desired surfactant can be selected for the present interlayer compositions. The surfactant may be used to improve the film quality. In embodiments, the surfactant is selected from the group consisting of a silicone modified polyacrylate, a polyester modified polydimethylsiloxane, a polyether modified polydimethylsiloxane, a polyacrylate modified polydimethylsiloxane, a polyester polyether modified polydimethylsiloxane, a low molecular weight ethoxylated polydimethylsiloxane, polyether modified polydimethylsiloxane, polyester modified polymethylalkylsiloxane, polyether modified polymethylalkylsiloxane, aralkyl modified polymethylalkylsiloxane, polyether modified polymethylalkylsiloxane, polyether modified polydimethylsiloxane, and combinations thereof.

In embodiments, the surfactant is a solvent based siloxane. In embodiments, the surfactant is a silicone modified polyacrylate. In embodiments, the concentration of the surfactant can be from about 0.01 weight percent to about 2 weight percent, or from about 0.1 weight percent to about 1.5 weight percent, or from about 0.5 weight percent to about 1 weight percent. The surfactant can be a polysiloxane copolymer that includes a polyester modified polydimethylsiloxane, commercially available from BYK Chemical with the trade name of BYK® 310; a polyether modified polydimethylsiloxane, commercially available from BYK Chemical with the trade name of BYK® 330; a polyacrylate modified polydimethylsiloxane, commercially available from BYK Chemical with the trade name of BYK®-SIL-CLEAN 3700 (about 25 weight percent in methoxypropylacetate); or a polyester polyether modified polydimethylsiloxane, commercially available from BYK Chemical with the trade name of BYK® 375. The surfactant can be a low molecular weight ethoxylated polydimethylsiloxane with the trade name Silsurf® A008 available from Siltech Corporation. For further detail, see U.S. patent application Ser. No. 13/716,892, filed Dec. 17, 2012, of Liu et al., which is hereby incorporated by reference herein in its entirety.

In embodiments, the surfactant is present and is selected from the group consisting of a polyester modified polydimethylsiloxane, a polyether modified polydimethylsiloxane, a polyacrylate modified polydimethylsiloxane, a polyester polyether modified polydimethylsiloxane, a low molecular weight ethoxylated polydimethylsiloxane, and combinations thereof.

The surfactant can be provided in the interlayer composition in any suitable or desired amount. In embodiments, the surfactant is present in an amount of from about 0.01 to about 2 percent, from about 0.1 to about 1.5 percent, or from about 0.5 to about 1 percent, by weight, based on the total weight of the interlayer composition.

The interlayer composition can optionally comprise a catalyst. Any suitable or desired catalyst can be selected for the present interlayer compositions. In embodiments, the catalyst is selected from the group consisting of amine salts of dodecylbenzene sulfonic acid (DDBSA), para toluene sulfonic acid, triflouromethane sulfonic acid, and combinations thereof.

The catalyst can be provided in the interlayer composition in any suitable or desired amount. In embodiments, the catalyst is present in an amount of from about 0.05 to about 1.5 percent, or from about 0.08 to about 1.0 percent, or from about 0.1 to about 0.5 percent, by weight, based on the total weight of the interlayer composition.

A cured film can be prepared from the present interlayer composition. The cured film has very good uniformity with less than 50 nanometers roughness as measured by Profilometers manufactured by NANOVEA®. In embodiments, the cured film thickness is from about 0.2 to about 5 micrometers and possesses a water contact angle of from about 65 degrees to about 95 degrees.

The present disclosure also encompasses a method for preparing the interlayer for transistor applications. In embodiments, a process for preparing a device comprises providing a substrate; disposing an interlayer composition on to the substrate, wherein the interlayer composition comprises: an epoxy compound; a polyvinyl phenol; a melamine resin; a solvent; an optional surfactant; and an optional catalyst; treating the interlayer composition to form a cured interlayer film; disposing a source electrode and a drain electrode on a surface of the interlayer; disposing a semiconductor layer on the interlayer, wherein the semiconductor layer is disposed into a gap between and over the source and drain electrode; wherein the interlayer serves as a back channel dielectric layer for the device and wherein the interlayer serves as a back channel interface comprising an interface between the semiconductor layer and the interlayer; disposing a gate dielectric layer on the semiconductor layer; and disposing a gate electrode on the dielectric layer.

FIG. 1 illustrates an example of disposing the semiconductor layer into a gap between and over at least a portion of the source and drain electrode.

In embodiments, the method comprises:

providing an epoxy interlayer composition as described herein, in embodiments, comprising an epoxy compound of formula (I), a polyvinyl phenol, a melamine resin, an optional catalyst, and a solvent;

disposing the epoxy interlayer composition onto a surface of an transistor; and thermally curing the disposed interlayer composition layer to form a cured interlayer film.

Further, a device containing the present epoxy interlayer composition can be prepared by any suitable or desired method. In embodiments, a process for forming conductive features on a substrate comprises depositing an interlayer composition as described herein onto a substrate; curing the interlayer to form an interlayer film; depositing a conductive composition onto the interlayer film to form deposited features; heating (or annealing) the deposited features to form conductive features.

Any suitable or desired material can be used to form the conductive features. In embodiments, a metal nanoparticle ink composition is selected. Xerox Corporation has developed ink jet inks, flexographic inks, and gravure inks based on silver nanoparticle technology. These inks can be selected for embodiments herein. U. S. Patent Publication 2014/0312284 (application Ser. No. 13/866,704, which is hereby incorporated by reference herein in its entirety, describes in the Abstract thereof a nanosilver ink composition including silver nanoparticles; a small amount of polymeric material (optional) and an ink vehicle. A process for preparing a nanosilver ink composition is described comprising combining silver nanoparticles, a small amount of polymeric material (optional) and an ink vehicle. A process for forming conductive features on a substrate using ink jet printing processes is described comprising providing a nanosilver ink composition comprising silver nanoparticles; a small amount of polymeric material (optional) and an ink vehicle; depositing the nanosilver ink composition onto a substrate to form deposited features; and heating the deposited features on the substrate to form conductive features on the substrate.

U.S. Pat. No. 8,324,294, which is hereby incorporated by reference herein in its entirety, describes in the Abstract thereof a nanosilver ink composition including silver nanoparticles; a resin; and an ink vehicle. A process for forming conductive features on a substrate is described including providing a nanosilver ink composition comprising silver nanoparticles, a resin and an ink vehicle; depositing the nanosilver ink composition onto a substrate to form deposited features; and heating the deposited features on the substrate to form conductive features on the substrate. Inks have been successfully formulated in non-polar solvents such as decalin and bicyclohexyl and successfully printed using inkjet printing technologies.

The interlayer and any layer or layers including conductive layers disposed thereon can be provided using any suitable or desired method. In embodiments, depositing the interlayer comprises solution depositing the interlayer, and wherein, in embodiments, solution depositing comprises a method selected from the group consisting of spin coating, dip coating, spray coating, slot die coating, flexographic printing, offset printing, screen printing, gravure printing, ink jet printing, and combinations thereof.

The depositing of the interlayer composition, and/or optionally the nanoparticle ink composition or other layers provided on the device, may be performed for example, by solution depositing. Solution depositing, for example, refers to a process where a liquid is deposited upon the substrate to form a coating or layer. This is in contrast to vacuum depositing processes. The present processes are also different from other solution-based processes, for example electroplating, which requires a plate to remain immersed in a solution and also requires exposure to an electric current to form a metal coating on the plate. The present process also offers several advantages compared to other process such as decreasing the amount of waste and decreasing the amount of time necessary to coat a substrate. Solution depositing includes, for example, spin coating, dip coating, spray coating, slot die coating, flexographic printing, offset printing, screen printing, gravure printing, or ink jet printing the interlayer composition onto the substrate.

In embodiments, disposing the interlayer composition comprises solution depositing the interlayer composition, and wherein the solution depositing comprises a method selected from the group consisting of spin coating, dip coating, spray coating, slot die coating, flexographic printing, offset printing, screen printing, gravure printing, ink jet printing, aerosol printing, and combinations thereof. In embodiments, disposing the interlayer composition comprises spin coating. In certain embodiments, disposing the interlayer composition comprises ink jet printing, aerosol printing, or a combination thereof.

In embodiments, a hybrid process herein comprises wherein the layers are formed from a combination of solution processing techniques such as ink jet printing and conventional techniques such as spin coating, vacuum deposition coating, and screen printing. In embodiments, a process herein comprises a hybrid process wherein the source and drain electrodes, the semiconductor layer, and the gate electrodes are disposed by ink jet printing; and wherein the interlayer composition and dielectric layer are disposed by conventional processes selected from the group consisting of spin coating, vacuum deposition coating, and screen printing. In certain embodiments, a process herein comprises a hybrid process wherein the source and drain electrodes, the semiconductor layer, and the gate electrodes are disposed by ink jet printing; and wherein the interlayer composition and dielectric layer are disposed by processes selected from the group consisting of spin coating, vacuum deposition coating, screen printing, gravure printing, ink jet printing, aerosol printing, and combinations thereof.

The film formed from the interlayer composition can be coated at any suitable or desired thickness. In embodiments, the dried film thickness of the interlayer is from about 0.2 to about 5 micrometers, or from about 0.5 to about 3 micrometers, or from about 0.75 to about 1 micrometers. In a specific embodiment, the coating thickness of the interlayer is from about 0.2 to about 1 micrometer.

The device can possess, in embodiments, the properties of the interlayer composition and film formed therefrom as described herein. In embodiments, the device includes a thermally cured film prepared from the interlayer composition wherein the thermally cured film possesses a water contact angle of from about 65 degrees to about 95 degrees. In embodiments, the thermally cured film possesses a surface roughness of from about 1 nanometer to about 10 nanometers. In embodiments, the thermally cured film has a glass transition temperature of from about minus 10° C. to about 100° C. In embodiments, the thermally cured film has a thickness of from about 0.1 micron (micrometer) to about 5 microns (micrometers).

The film can be thermally cured at any suitable or desired temperature. In embodiments, thermal curing can comprise curing at a temperature range of from about 120° C. to about 160° C. for any suitable or desired amount of time, in embodiments for from about 2 hours to about 6 hours. In embodiments, a cured film is provided by thermally curing the interlayer composition described herein at a temperature of from about 100° C. to about 200° C.

The device and process herein can comprise forming conductive features from a metal ink composition. In embodiments, the conductive composition comprises a metal nanoparticle ink composition. The fabrication of conductive features, such as an electrically conductive element, from a metal ink composition, for example, from a nanoparticle metal ink, such as a nanosilver ink composition, can be carried out by depositing the composition on a substrate using any suitable deposition technique including solution processing and flexographic and gravure printing processes at any suitable time prior to or subsequent to the formation of other optional layer or layers on the substrate. Thus deposition of the ink composition on the substrate can occur either on a substrate or on a substrate already containing layered material, for example, a substrate having disposed thereon the present interlayer composition.

The substrate may be any suitable substrate including silicon, glass plate, plastic film, sheet, fabric, or synthetic paper. For structurally flexible devices, plastic substrates such as polyester, polycarbonate, polyimide sheets, polyethylene terephthalate (PET) sheet, polyethylene naphthalate (PEN) sheet, and the like, may be used. The thickness of the substrate can be any suitable thickness such as about 10 micrometers to over 10 millimeters with an exemplary thickness being from about 50 micrometers to about 2 millimeters, especially for a flexible plastic substrate, and from about 0.4 to about 10 millimeters for a rigid substrate such as glass or silicon. In embodiments, the substrate is selected from the group consisting of silicon, glass plate, plastic film, sheet, fabric, paper, and combinations thereof.

In embodiments, a device herein can comprise a substrate, an interlayer disposed thereover, and a conductive ink composition disposed over the interlayer.

Heating the deposited conductive ink composition can be to any suitable or desire temperature, such as to from about 70° C. to about 200° C., or any temperature sufficient to induce the metal nanoparticles to "anneal" and thus form an electrically conductive layer which is suitable for use as an electrically conductive element in electronic devices. The heating temperature is one that does not cause adverse changes in the properties of previously deposited layers or the substrate. In embodiments, use of low heating temperatures allows use of low cost plastic substrates which have an annealing temperature of below 140° C.

The heating can be for any suitable or desire time, such as from about 0.01 second to about 10 hours. The heating can be performed in air, in an inert atmosphere, for example under nitrogen or argon, or in a reducing atmosphere, for example, under nitrogen containing from about 1 to about 20 percent by volume hydrogen. The heating can also be performed under normal atmospheric pressure or at a reduced pressure of, for example, about 1000 mbars to about 0.01 mbars.

Heating encompasses any technique that can impart sufficient energy to the heated material or substrate to (1) anneal the metal nanoparticles and/or (2) remove the optional stabilizer from the metal nanoparticles. Examples of heating techniques include thermal heating (for example, a hot plate, an oven, and a burner), infra-red ("IR") radiation, laser beam, flash light, microwave radiation, or ultraviolet ("UV") radiation, or a combination thereof.

In embodiments, after heating, the resulting electrically conductive line has a thickness ranging from about 0.1 to about 20 micrometers, or from about 0.15 to about 10 micrometers. In certain embodiments, after heating, the resulting electrically conductive line has a thickness of from about 0.1 to about 2 micrometers.

The conductivity of the resulting metal element produced by heating the deposited metal ink composition is, for example, more than about 100 Siemens/centimeter (S/cm), more than about 1,000 S/cm, more than about 2,000 S/cm, more than about 5,000 S/cm, more than about 10,000 S/cm, or more than about 50,000 S/cm.

The resulting elements can be used for any suitable or desired application, such as for electrodes, conductive pads, interconnects, conductive lines, conductive tracks, and the like, in electronic devices such as thin film transistors, organic light emitting diodes, RFID tags, photovoltaic, displays, printed antenna, and other electronic devise which required conductive elements or components.

In embodiments, a device herein comprises an organic thin film transistor comprising a substrate; an interlayer disposed on the substrate, wherein the interlayer comprises a cured film formed from an interlayer composition, wherein the interlayer composition comprises: an epoxy compound; a polyvinyl phenol; a melamine resin; a solvent; an optional surfactant; and an optional catalyst; a source electrode and a drain electrode disposed on a surface of the interlayer; a semiconductor layer disposed on the interlayer, wherein the semiconductor layer is disposed into a gap between and on a top surface of the source and drain electrode; a back channel interface comprising an interface between the semiconductor layer and the interlayer, wherein the interlayer serves as a back channel dielectric layer for the device; a dielectric layer disposed on the semiconductor layer; a gate electrode disposed on the dielectric layer; wherein the thin film transistor has a current on-off ratio of at least about $10^{-5}$.

In embodiments, a channel formed by the gap between the source and drain electrodes has a large ratio of channel width to channel length.

In embodiments, the thin film transistor has a sub-threshold slope of less than about 1 V/dec. In embodiments, the thin film transistor has a sub-threshold slope of about 0.6 V/dec.

In embodiments, the interlayer herein provides a proper wettability for silver inks to form well defined line width and line-to-line spacing. In embodiments, the line spacing is less than about 35 µm. In embodiments, the interlayer provides a wettability sufficient to enable formation of a silver ink line spacing of less than about 35 µm.

In embodiments, the interlayer cured film has a roughness of less than 50 nanometers as measured by Profilometers manufactured by NANOVEA®.

In embodiments, the interlayer cured film has a thickness of from about 0.2 to about 5 micrometers.

In embodiments, the interlayer cured film has a water contact angle of from about 65 degrees to about 95 degrees.

EXAMPLES

The following Examples are being submitted to further define various species of the present disclosure. These Examples are intended to be illustrative only and are not intended to limit the scope of the present disclosure. Also, parts and percentages are by weight unless otherwise indicated.

Example 1

Interlayer compositions were prepared having the components provided in the weight percentage of each component as described below.

Interlayer Components and Formulation.

10-50% by weight of Poly(propylene glycol) diglycidyl ether (PLGDE) Mn=380-2000; from Sigma-Aldrich.

5-20% by weight Poly(melamine-co-formaldehyde) methylated, solution from Sigma-Aldrich, average Mn~432, 84 wt. % in 1-butanol.

5-30% by weight Poly(4-vinylphenol) (PVP powder); average Mw~25,000.

20-80% by weight Propylene glycol methyl ether acetate (PGMEA) CAS#108-65-6 from Sigma-Aldrich.

Solution Preparation.

Step 1. A 10 to 30% poly(4-vinylphenol) (PVP) solution was prepared as follows. 70 to 90 grams propylene glycol methyl ethyl acetate (PGMEA) solvent were charged into a glass bottle, followed by slowly adding 10 to 30 grams PVP into the solvent with magnetic stirring at a speed of about 250 rpm/minute to around 500 rpm/minute. The stirring was continued for about one to two hours until the PVP was totally dissolved in PGMEA solvent and the solution was clear.

Step 2. The interlayer composition components were then combined as follows. The components were combined in a glass bottle in the amounts shown, as follows. The rest of the solvent was loaded into a glass bottle first, followed by the addition of the epoxy resin (Poly(propylene glycol) diglycidyl ether), the resin was totally dispersed in the solvent, followed by adding the Poly(melamine-co-formaldehyde) methylated, solution (PMMF) and dispersing the PMMF in the mixture before loading the PVP solution. The mixture was then roll-milled at 175 RPM for at least 2 hours.

Step 3. The interlayer solution was coated on different substrates such as glass, polycarbonate (PC), polyethylene terephthalate (PET), polyethylene-naphthalate (PEN) film. The coating was cured at 120° C. for about 1-5 hours. The coated film thickness after cured is from 200 nm to around 5 microns.

Example 2

Ink jet printing silver traces on the interlayer.

Samples were prepared by spin coating each of the interlayer formulations at 1600 RPM for 60 seconds, on polyethylene naphthalate (PEN) substrates. Subsequently, the samples were cured at 160° C. for 5 hours in a vacuum oven.

Silver Nanoparticle Ink Composition.

A silver nanoparticle ink was prepared as described in U.S.

Patent Publication 2014/0312284 (application Ser. No. 13/866,704, which is hereby incorporated by reference herein in its entirety.

The silver nanoparticle ink composition was prepared by mixing silver nanoparticle powders with a solvent mixture of bicyclohexane and phenylcyclohexane at a 3:2 ratio. The silver nanoparticles are 50 weight percent of the silver formulation. After the silver nanoparticles were mixed into the solvents, the composition was filtered using a 1.0 µm syringe filter. The composition was printed using a DMP-2800 ink jet printer equipped with 10 pL cartridges. After printing and thermal annealing, the highly conductive features were formed.

Silver nano particle ink (from Colloidal, with 15% Ag loading) was printed onto the surface of the interlayer, with droplet spacing of 42 millimeters.

Figure 2:
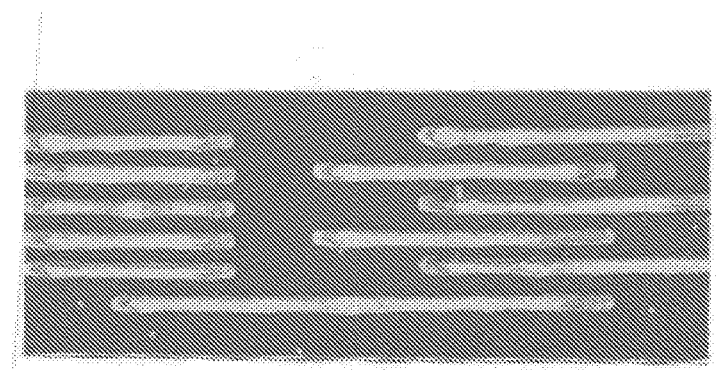
FIG. 2 illustrates a microscope image of printed Ag lines printed onto an epoxy interlayer in accordance with the present embodiments.

FIG. 2 illustrates a microscope image of printed Ag lines. The line width and height are 50 nanometers and 300 nanometers respectively. The gap between each electrode is about 30 millimeters. The printed traces conducted well after sintering at 120° C. for 30 minutes.

Figure 3A:
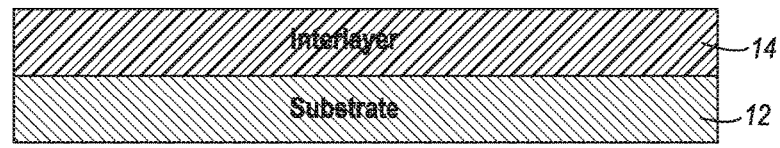
FIG. 3A illustrates processing steps for preparing an organic thin film transistor with the interlayer dielectric as the back channel interface material in accordance with the present embodiments.
Figure 3B:
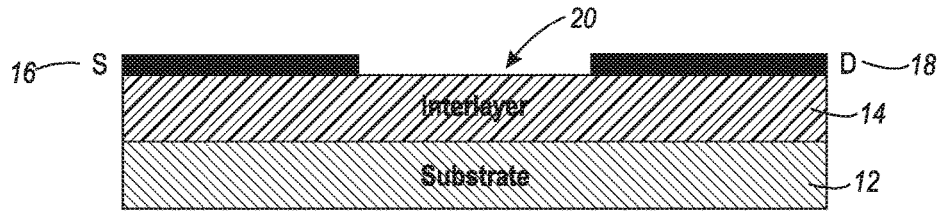
FIG. 3B illustrates further processing steps for preparing an organic thin film transistor in accordance with the present embodiments.
Figure 3C:
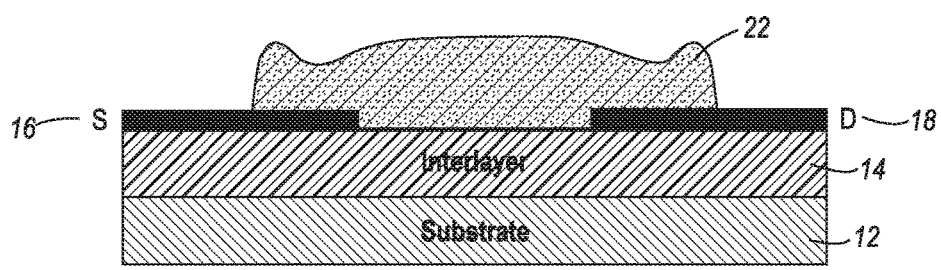
FIG. 3C illustrates further processing steps for preparing an organic thin film transistor in accordance with the present embodiments.
Figure 3D:
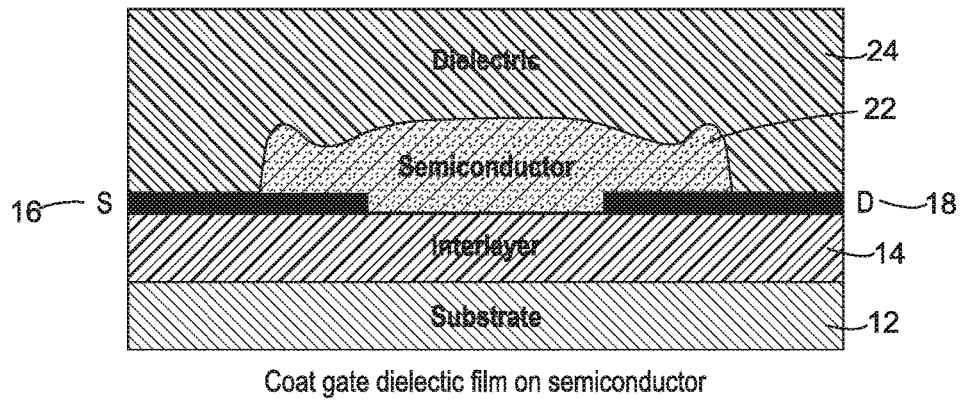
FIG. 3D illustrates further processing steps for preparing an organic thin film transistor in accordance with the present embodiments.
Figure 3E:
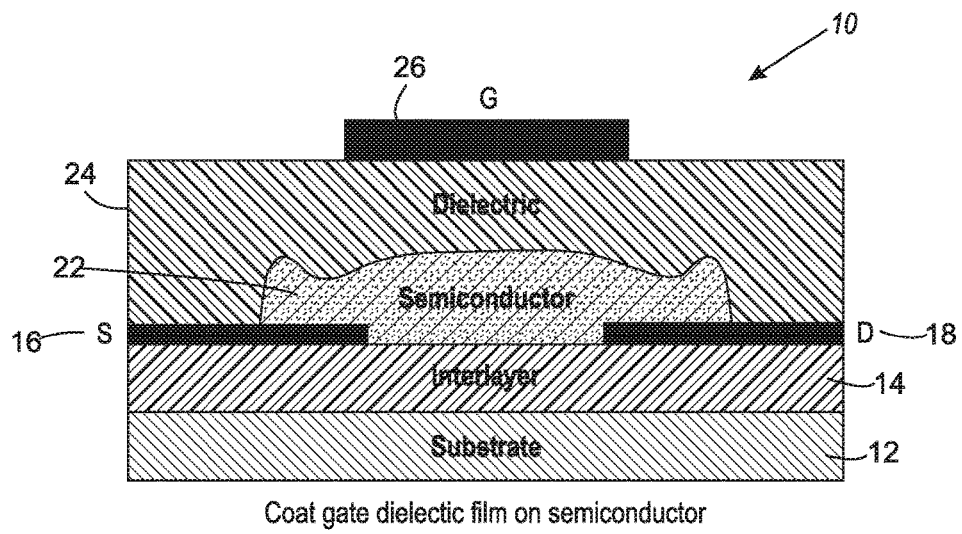
FIG. 3E illustrates further processing steps for preparing an organic thin film transistor in accordance with the present embodiments.

FIGS. 3A-3E illustrate processing steps for preparing an organic thin film transistor 10 with the interlayer dielectric 14 serving as the back channel interface material. The process starts with coating the interlayer dielectric 14 over a substrate 12 as shown in FIG. 3A. A typical coating condition is spin coating at 1600 RPM for 60 seconds. The layer is cured by thermal annealing at 160° C. for 5 hours. Next, the device source 16 and drain electrodes 18 are formed on the surface of the interlayer dielectric 14, such as by ink jetting silver nanoparticle ink, such as Colloidal ink with 15% silver loading. Gap 20 exists between source 16 and drain 18 electrodes. Since the interlayer dielectric 14 has a proper wettability with the Ag ink, the printed trace is well defined with about 30 millimeter spacing between the source 16 and drain 18 electrode as shown in FIG. 3B. After sintering at 120° C. for 30 minutes, the printed ink is electrically conductive. Next, p-type semiconductor ink such as FlexInk12 from FlexInk is printed onto the gap 20 between the source and drain electrodes to form semiconductor layer 22. The printing was performed at a substrate temperature of 60° C. See FIG. 3C. After a brief anneal at 120° C. for 10 minutes, a stack of gate dielectric layers 24 were spin coated over the printed semiconductor along with the rest of the elements on the substrate as shown in FIG. 3D. The gate dielectric layer 24 includes 50 nanometer Teflon™, 900 nm PVDF-TrFE-CTFE relaxor polymer. Each layer is thermally cured at 120° C. before coating the next layer. Next, a gate electrode 26 is formed by ink jetting silver nano particle ink and sintering. See FIG. 3E. To contact the source and drain electrode, a laser drill through the gate dielectric stack was applied and followed by printing Ag pads connecting to the source and drain electrodes through the bias (not shown).

Figure 4:
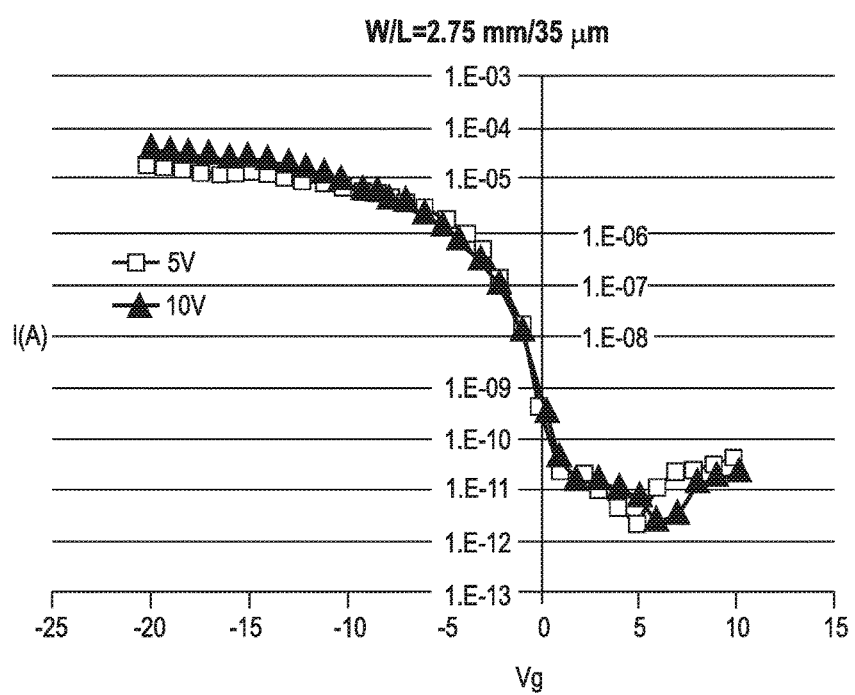
FIG. 4 is a graph illustrating transistor transfer characteristics.

FIG. 4 shows the OTFT transfer characteristics, which has low off-state leakage current and good sub-threshold slope. The low off-state current results in a high current on-off ratio. This performance indicates that the interlayer provides the desired property as the back channel dielectric.

Thus, in embodiments, an interlayer coating herein provides at least two distinctive features for printed OTFTs:

1. a proper wettability for Ag inks to form well defined line width and line-to-line spacing;
2. service as the back channel dielectric layer for the transistor. With these features, the performance of OTFTs is dramatically improved.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A device comprising:
a substrate;
an interlayer disposed on the substrate, wherein the interlayer comprises a cured film formed from an interlayer composition, wherein the interlayer composition comprises:
an epoxy compound;
wherein the epoxy compound is an aliphatic epoxy compound or epoxy polymer made therefrom, wherein the aliphatic epoxy compound is a compound of the formula

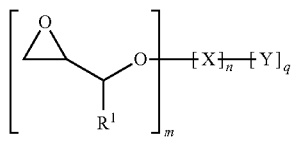

wherein X is a saturated or unsaturated, linear, branched or cyclic aliphatic group having 1 to 60 carbon atoms and at least one oxygen atom;
wherein Y is selected from the group consisting of a glycidyl group, an epoxy group, an oxyalkyl (—OR) group, and a hydroxyl group, wherein R is an alkyl;
wherein $R^1$ is selected from the group consisting of hydrogen, alkyl, or $OR^2$, wherein $R^2$ is a $C_1$ to $C_3$ alkyl group or an epoxy group;
wherein m is from about 1 to about 10;
wherein n is from about 1 to about 20; and
wherein q is from about 0 to about 10;
a polyvinyl phenol;
a melamine resin;
a solvent;
an optional surfactant; and
an optional catalyst;
a source electrode and a drain electrode disposed on a surface of the interlayer;
a semiconductor layer disposed on the interlayer, wherein the semiconductor layer is disposed into a gap between and over the source and drain electrode;
a back channel interface comprising an interface between the semiconductor layer and the interlayer, wherein the interlayer serves as a back channel dielectric layer for the device;
a gate dielectric layer disposed on the semiconductor layer;
a gate electrode disposed on the dielectric layer.

2. The device of claim 1, wherein the substrate is selected from the group consisting of silicon, glass plate, plastic film, sheet, fabric, and synthetic paper.

3. The device of claim 1, wherein the substrate is selected from the group consisting of polyester, polycarbonate, polyimide sheets, polyethylene terephthalate sheet, and polyethylene naphthalate sheet.

4. The device of claim 1, wherein the polyvinyl phenol is selected from the group consisting of poly(4-vinylphenol), poly(vinylphenol)/poly(methyl acrylate), poly(vinylphenol)/poly(methyl methacrylate), poly(4-vinylphenol)/poly(vinyl methyl ketone), and combinations thereof.

5. The device of claim 1, wherein the melamine resin is selected from the group consisting of poly(melamine-co-formaldehyde), methylated poly(melamine-co-formaldehyde), butylated poly(melamine-co-formaldehyde), isobutylated poly(melamine-co-formaldehyde), acrylated poly(melamine-co-formaldehyde), methylated/butylated poly(melamine-co-formaldehyde), and combinations thereof.

6. The device of claim 1, wherein the melamine resin comprises a poly(melamine-co-formaldehyde) based polymer.

7. The device of claim 1, wherein the cured film is formed by thermally curing the interlayer composition at a temperature of from about 100° C. to about 200° C.

8. The device of claim 1, wherein the solvent is selected from the group consisting of propylene glycol methyl ether acetate, toluene, methyl isobutyl ketone, butylacetate, methoxypropylacetate, xylene, tripropyleneglycol monomethylether, dipropyleneglycol monomethylether, propoxylated neopentylglycoldiacrylate, and combinations thereof.

9. The device of claim 1, wherein the interlayer cured film has a thickness of from about 0.2 to about 5 micrometers.

10. The device of claim 1, wherein the interlayer cured film has a water contact angle of from about 65 degrees to about 95 degrees.

11. The device of claim 1:
wherein the device is an organic thin film transistor, wherein the thin film transistor has a current on-off ratio of at least about $10^{-5}$.

12. The device of claim 1:
wherein the device is an organic thin film transistor, wherein the thin film transistor has a sub-threshold slope of less than about 1 V/dec.

13. A device comprising:
a substrate;
an interlayer disposed on the substrate, wherein the interlayer comprises a cured film formed from an interlayer composition, wherein the interlayer composition comprises:
an epoxy compound;
wherein the epoxy compound of the interlayer composition is selected from the group consisting of 1,4-butanediyl diglycidyl ether of the formula

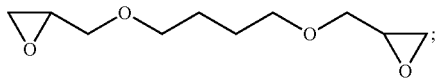 [SMILES: C(CCOCC1CO1)COCC1CO1]

1,6-hexanediol diglycidyl ether of the formula

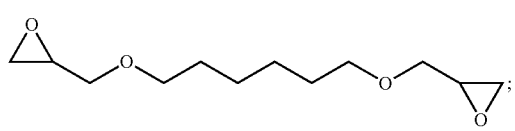 [SMILES: C(CCCOCC1CO1)CCOCC1CO1]

1,4-cyclohexanedimethanol diglycidyl ether of the formula

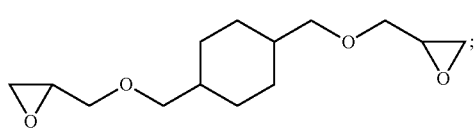 [SMILES: C1CC(COCC2CO2)CCC1COCC1CO1]

21 neopentyl glycol diglycidyl ether of the formula

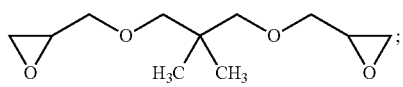

1,2,3Propanetriol glycidyl ethers of the formula

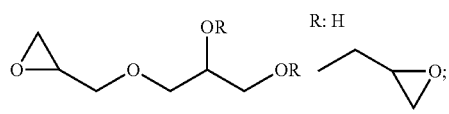

trimethylolpropane triglycidyl ether of the formula

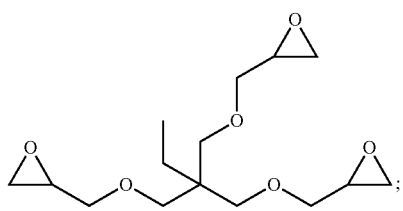 [SMILES: CCC(COCC1CO1)(COCC1CO1)COCC1CO1]

epichlorohydrin polymer of the formula

22 pentaerythritrol polyglycidyl ether of the formula

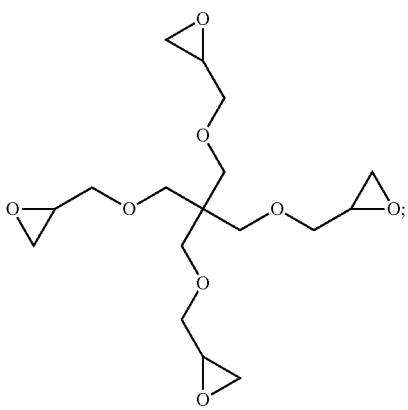

poly(ethylene glycol) diglycidyl ether of the formula

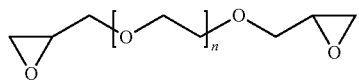

wherein n is from 2 to 15; and poly(propylene glycol) diglycidyl ether of the formula

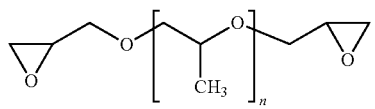

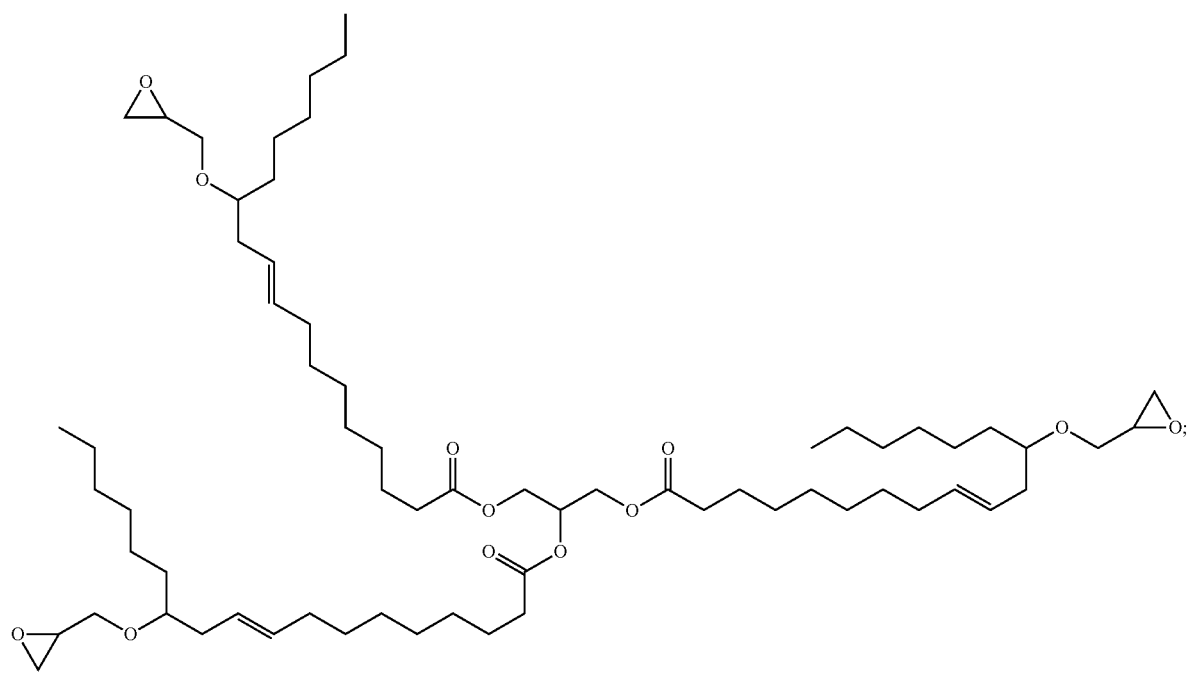

wherein n is from 2 to 10;
a polyvinyl phenol;
a melamine resin;
a solvent;
an optional surfactant; and
an optional catalyst;
a source electrode and a drain electrode disposed on a surface of the interlayer;
a semiconductor layer disposed on the interlayer, wherein the semiconductor layer is disposed into a gap between and over the source and drain electrode;
a back channel interface comprising an interface between the semiconductor layer and the interlayer, wherein the interlayer serves as a back channel dielectric layer for the device;
a gate dielectric layer disposed on the semiconductor layer;
a gate electrode disposed on the dielectric layer.

14. A process for preparing a device comprising:
providing a substrate;
disposing an interlayer composition on to the substrate, wherein the interlayer composition comprises:
an epoxy compound;
wherein the epoxy compound is an aliphatic epoxy compound or epoxy polymer made therefrom, wherein the aliphatic epoxy compound is a compound of the formula

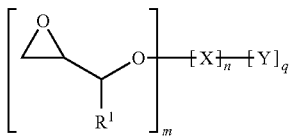

wherein X is a saturated or unsaturated, linear, branched or cyclic aliphatic group having 1 to 60 carbon atoms and at least one oxygen atom;
wherein Y is selected from the group consisting of a glycidyl group, an epoxy group, an oxyalkyl (—OR) group, and a hydroxyl group, wherein R is an alkyl;
wherein $R^1$ is selected from the group consisting of hydrogen, alkyl, or $OR^2$, wherein $R^2$ is a $C_1$ to $C_3$ alkyl group or an epoxy group;
wherein m is from about 1 to about 10;
wherein n is from about 1 to about 20; and
wherein q is from about 0 to about 10;
a polyvinyl phenol;
a melamine resin;
a solvent;
an optional surfactant; and
an optional catalyst;
treating the interlayer composition to form a cured interlayer film;
disposing a source electrode and a drain electrode on a surface of the interlayer;
disposing a semiconductor layer disposed on the interlayer, wherein the semiconductor layer is disposed into a gap between the source and drain electrode;
wherein the interlayer serves as a back channel dielectric layer for the device and wherein the interlayer serves as
a back channel interface comprising an interface between the semiconductor layer and the interlayer;
disposing a dielectric layer on the semiconductor layer; and
disposing a gate electrode on the dielectric layer.

15. The process of claim 14, wherein treating the interlayer composition comprises thermally curing the interlayer composition at a temperature of from about 100° C. to about 200° C.

16. The process of claim 14, wherein disposing the interlayer composition comprises solution depositing the interlayer composition, and wherein the solution depositing comprises a method selected from the group consisting of spin coating, dip coating, spray coating, slot die coating, flexographic printing, offset printing, screen printing, gravure printing, ink jet printing, aerosol printing, and combinations thereof.

17. The process of claim 14, wherein disposing the interlayer composition comprises ink jet printing, aerosol printing, or a combination thereof.

18. The process of claim 14, further comprising a hybrid process wherein the source and drain electrodes, the semiconductor layer, and the gate electrodes are disposed by ink jet printing; and
wherein the interlayer composition and dielectric layer are disposed by processes selected from the group consisting of spin coating, vacuum deposition coating, screen printing, gravure printing, ink jet printing, aerosol printing, and combinations thereof.

19. A device comprising:
a substrate;
an interlayer disposed on the substrate, wherein the interlayer comprises a cured film formed from an interlayer composition, wherein the interlayer composition comprises:
an epoxy compound;
a polyvinyl phenol;
a melamine resin;
wherein the melamine resin is selected from the group consisting of poly(melamine-co-formaldehyde), methylated poly(melamine-co-formaldehyde), butylated poly(melamine-co-formaldehyde), isobutylated poly(melamine-co-formaldehyde), acrylated poly(melamine-co-formaldehyde), methylated/butylated poly(melamine-co-formaldehyde), and combinations thereof;
a solvent;
an optional surfactant; and
an optional catalyst;
a source electrode and a drain electrode disposed on a surface of the interlayer;
a semiconductor layer disposed on the interlayer, wherein the semiconductor layer is disposed into a gap between and over the source and drain electrode;
a back channel interface comprising an interface between the semiconductor layer and the interlayer, wherein the interlayer serves as a back channel dielectric layer for the device;
a gate dielectric layer disposed on the semiconductor layer; and
a gate electrode disposed on the dielectric layer.

* * * * *